(12) United States Patent
Yazdanbakhsh et al.

(10) Patent No.: US 9,384,858 B2
(45) Date of Patent: Jul. 5, 2016

(54) COMPUTER SYSTEM PREDICTING MEMORY FAILURE

(71) Applicant: Wisconsin Alumni Research Foundation, Madison, WI (US)

(72) Inventors: Amir Yazdanbakhsh, Atlanta, GA (US); Raghuraman Balasubramanian, Bellevue, WA (US); Anthony Nowatzki, Madison, WI (US); Karthikeyan Sankaralingam, Madison, WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 60 days.

(21) Appl. No.: 14/549,979

(22) Filed: Nov. 21, 2014

(65) Prior Publication Data

US 2016/0148707 A1    May 26, 2016

(51) Int. Cl.
| | |
|---|---|
| *G11C 29/00* | (2006.01) |
| *G11C 29/38* | (2006.01) |
| *G11C 11/419* | (2006.01) |
| *G11C 29/42* | (2006.01) |
| *G11C 29/50* | (2006.01) |

(52) U.S. Cl.
CPC ............ *G11C 29/38* (2013.01); *G11C 11/419* (2013.01); *G11C 29/42* (2013.01); *G11C 29/50004* (2013.01)

(58) Field of Classification Search
CPC ...... G11C 29/38; G11C 11/419; G11C 29/42; G11C 2/5004; G11C 29/509
USPC ........... 714/719, 721, 745, 819, 824; 365/201
See application file for complete search history.

(56) References Cited

U.S. PATENT DOCUMENTS

| | | | |
|---|---|---|---|
| 5,233,615 A | 8/1993 | Goetz | |
| 6,118,703 A * | 9/2000 | Hamaguchi | ........ G11C 16/3454 365/185.22 |
| 7,560,945 B2 | 7/2009 | Singh | |
| 7,642,864 B2 | 1/2010 | Chuang et al. | |
| 7,653,854 B2 * | 1/2010 | Anzou | .................... G11C 29/16 714/733 |
| 7,949,482 B2 | 5/2011 | Gebara et al. | |
| 8,341,473 B2 | 12/2012 | Bertacco et al. | |
| 8,352,781 B2 * | 1/2013 | Garg | ................. G06F 11/1048 714/42 |
| 2008/0036487 A1 | 2/2008 | Bradley et al. | |
| 2011/0090015 A1 | 4/2011 | Sumita et al. | |
| 2011/0173432 A1 | 7/2011 | Cher et al. | |

FOREIGN PATENT DOCUMENTS

WO    2011083123    7/2011

OTHER PUBLICATIONS

Shuou Nomura, Matthew D. Sinclair, Chen-Han Ho, Venkatraman Govindaraju, Marc De Kruijf, Karthikeyan Sankaralingam; Sampling + DMR: Practical and Low-overhead Permanent Fault Detection; Symposium; Jun. 4-8, 2011; ISCA '11; San Jose, California, USA.

* cited by examiner

*Primary Examiner* — Christine Tu
(74) *Attorney, Agent, or Firm* — Boyle Fredrickson, S.C.

(57) ABSTRACT

The prediction of memory failure is obtained by reducing the voltage on a bank of memory cells to momentarily artificially age the memory cells and subjecting the memory cells to a test in which one or more predetermined vectors are written to and read from the memory cells to detect memory cell errors.

18 Claims, 4 Drawing Sheets

COMPUTER SYSTEM PREDICTING MEMORY FAILURE

STATEMENT REGARDING FEDERALLY SPONSORED RESEARCH OR DEVELOPMENT

This invention was made with government support under 1117782 awarded by the National Science Foundation. The government has certain rights in the invention.

CROSS REFERENCE TO RELATED APPLICATION

--

BACKGROUND OF THE INVENTION

The present invention relates to solid-state electronic computer memories and in particular to a method and apparatus for anticipating age-related failure of transistor memory cells.

Solid-state electronic computer memories employ memory cells constructed of transistor elements that store at least two operating states associated with binary values of "one" and "zero". Static random access memory (SRAM) employs a bi-stable latch circuit which holds its storage state indefinitely so long as power is applied. Dynamic random access memory (DRAM) stores its state in the form of a charge on capacitor. This charge slowly dissipates even when power is applied to the memory and must be "refreshed" periodically. Both forms of memory are "volatile" meaning that they lose their states when power is removed.

The transistors of both SRAM and DRAM change with age and such changes may ultimately lead to memory cell failure. Some types of memory cell failure may be detected using error correction codes (ECC) which provide for redundant memory bits and may be used to detect, after-the-fact, limited numbers of failures in a memory word comprised of multiple bits.

Logical gates are building block circuit elements of digital integrated circuits such as microprocessors. Logic gates implement a Boolean function using multiple transistors to receive an input at one or more inputs, interpret the inputs as logic levels, and provide an output voltage being the Boolean function of the inputs. Logical gates are normally combined to create more complex devices including counters, storage registers, and the like, the latter of which may be assembled into a processor or the like.

Like memory cells, logical gates are subject to age-related failure. After-the-fact detection of logical gate failure can be provided by redundant execution on two gate structures and comparing the outputs of the structures. Under the assumption that both structures will not fail simultaneously, this comparison will detect a wide variety of errors.

Co-pending U.S. application Ser. No. 14/012,255 entitled "Integrated Circuit Providing Fault Prediction" filed Aug. 28, 2013, assigned to the assignee of the present invention and hereby incorporated in its entirety by reference, provides a method of predicting failure of logical gates. This technique makes a comparison between the two similar circuit modules (for example, processor cores) where one is momentarily artificially aged. This aging process, for example, may be performed by lowering the operating voltage of one of the circuit modules to aggravate gate delay or by decreasing the "slack time", that is, the time in excess of the guard band time normally allotted for state transition, to increase sensitivity to aging-induced gate delay. The outputs of the circuit modules are compared to predict failure in the aged circuit module. By using actual elements of the target circuit and by being able to predict further into the future through artificial aging, the likelihood of detecting infrequent errors caused by faults is increased, resulting in high accuracy. By rotating the aged circuit module through all circuit modules, good detection coverage may be obtained, and by employing a sampling with prediction the overhead of the redundancy is greatly reduced.

The above described failure prediction technique cannot be readily extended to memory circuits where redundant memory structures having the same data are normally not available for comparison and where the circuitry and/or time required to routing duplicate data to different memory structures would be prohibitive.

SUMMARY OF THE INVENTION

The present invention provides a system for predicting memory faults by artificially aging the memory circuit while it is tested with a predetermined memory check vector. The memory check vector eliminates the need for redundant memory structures while the aging permits predicted failure detection. The portion of memory being checked may be small and rotated through the entire memory structure to minimize the overhead of the checking process while allowing memory failure prediction of large memory structures. When used in conjunction with conventional error correcting systems, the invention may prolong the time before which a memory block must be disabled after an error is detected by the error correcting system.

In one embodiment, the invention provides an integrated circuit system including memory cells organized in groups and addressable to allow reading and writing of binary values to the memory cells. A voltage control system permits independent application of a controllable voltage to the memory cells of the different groups, and a memory reliability circuit communicates with the memory cells and voltage control system to, for a given group: (a) reduce the voltage applied to the given group using the voltage control system to less than an operating voltage applied to other memory cells of other groups to simulate aging of the given group; (b) write a test vector to the memory cells of the given group; (c) read the test vector from the memory cells of the given group as a modified test vector change by any memory cell failure; (d) compare the test vector to the modified test vector; and (e) provide an output indicating predicted failure of the given group when the test vector does not match the modified test vector.

It is thus a feature of at least one embodiment of the invention to provide a method of predicting failure in solid-state memories, for example, that may be used in conjunction with the prediction of errors in logic gates.

The memory reliability circuit may cycle through the groups of memory cells changing the given group in each cycle.

It is thus a feature of at least one embodiment of the invention to permit concurrent checking of memory faults with operation of a processor by a piece-wise testing of portions of the memory and rotating the portions over successive short intervals.

The integrated circuit system may include error correction circuitry associated with each group for correcting the effect of memory cell failure up to a predetermined number of memory cell failures, and the memory reliability circuit may read the modified test vector from the memory cells of the group after correction of errors by the error correction circuitry.

It is thus a feature of at least one embodiment of the invention to work in conjunction with error correction techniques to prolong the operating life of the memory.

The integrated circuit system may further include decommissioning circuitry for decommissioning a group of memory cells upon receiving the output indicating predicted failure of the group.

It is thus a feature of at least one embodiment of the invention to decommission memory circuitry before failure such as might create more significant problems.

The decommissioning circuitry may decommission the group of memory cells upon receiving the output indicating predicted failure of the group but not upon a failure less than the predetermined number of memory cell failures detected by the error correction circuitry.

It is thus a feature of at least one embodiment of the invention to extend the life of memory subject to error correction by allowing operation of memory with corrected faults.

The memory reliability circuit may further move the data of the group to another storage location before writing the test vector.

It is thus a feature of at least one embodiment of the invention to permit concurrent memory checking during processing without disruption of processor operation.

The memory cells may be part of a cache memory.

It is thus a feature of at least one embodiment of the invention to provide a system for checking cache memory that may make use of normal cache protocols for eviction and invalidation to operate invisibly to the processor.

The test vector may write a nonuniform predetermined data pattern to the memory cells of the data group to promote memory cell failures promoted by interaction of memory cells.

It is thus a feature of at least one embodiment of the invention to provide a flexible test procedure that may be tailored to anticipated memory faults related to a particular memory architecture.

The integrated circuit system may include a processor executing out-of-order and the memory reliability circuit initiates the cycle of steps OHO using a precise interrupt from the processor.

It is thus a feature of at least one embodiment of the invention to permit the memory check operation with minimized effect on the architectural state of the processor by properly timing the check operations.

The voltage reduction may simulate an aging of the memory cells by less than one month or less than one day.

It is thus a feature of at least one embodiment of the invention to maximize operating life of the processor by providing short prediction windows.

The memory reliability circuit may receive a data value controlling the amount of aging.

It is thus a feature of at least one embodiment of the invention to permit a tailoring of the prediction window for different applications requiring different reliabilities.

The processor may further include at least a first and second redundant circuit module each including multiple logic gates subject to increased gate delay with age, the first and second redundant circuit modules generating first and second respective outputs; and the integrated circuit system may include gate reliability circuitry operating to: (a) momentarily and selectively apply a stress to the first redundant circuit module in a manner mimicking age-increased gate delay without applying the stress to the second redundant circuit module; (h) capture first and second values based on the respective first and second outputs from first and second redundant circuit modules during the stressing; and (c) compare the captured first and second values to detect errors caused by the selective stressing.

It is thus a feature of at least one embodiment of the invention to provide a system that may check both gate logic and memory circuitry for comprehensive fault prediction.

The gate reliability circuit may execute step (a) at nonoverlapping times with execution by the memory reliability circuit of steps (a)-(c).

It is thus a feature of at least one embodiment of the invention to provide a system for predicting both logic faults and memory faults without interference between the two.

The gate reliability circuit may initiate the execution of step (a) repeatedly at a different rate than an initiation of execution by the memory reliability circuit of steps (a)-(c).

It is thus a feature of at least one embodiment of the invention to provide a system that may flexibly tailor prediction cycles according to the relative amounts of memory and logic circuitry that must be checked.

These particular objects and advantages may apply to only some embodiments falling within the claims and thus do not define the scope of the invention.

DETAILED DESCRIPTION OF THE PREFERRED EMBODIMENT

Figure 1:
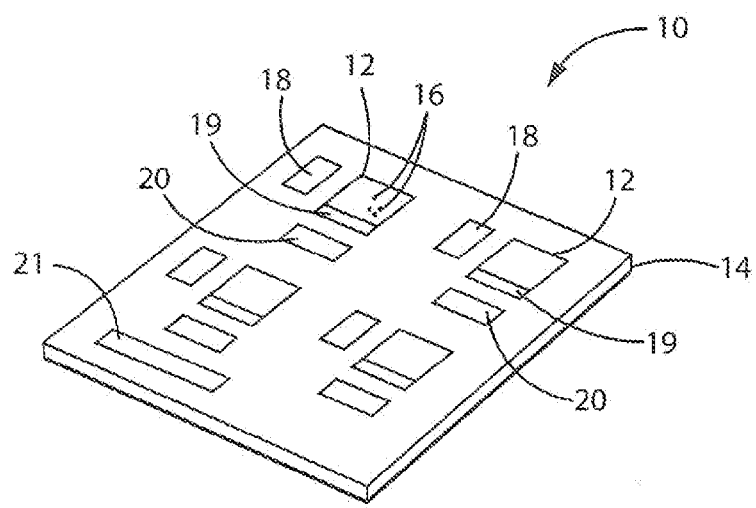
FIG. 1 is a simplified perspective view of a multicore processor, being an example circuit that may be used with the present invention, showing multiple cores associated with random access memory, each core having a gate reliability circuit for predicting failure in the cores and a memory reliability circuit for predicting failure in the random-access memory associated with that core, the gate reliability circuit and the memory reliability circuit coordinated by a global reliability circuit.

Referring now to FIG. 1, an integrated circuit 10 operating according to the present invention, for example, may provide for a microprocessor system having multiple processing cores 12 fabricated on a common substrate 14. As is understood in the art, each of the cores 12 will be composed of multiple gates 16 including, for example, Boolean logic gates such as AND-or OR-gates which may be assembled into other well-known, structures including latches, counters, and arithmetic elements such as adders, shifters and the like as is generally understood in the art. These structures may together form computer structures such as an arithmetic logic unit (ALU), registers and the like. Each of these gates 16 may be constructed using complementary metal-oxide-semiconductor (CMOS) architectures; however, the present invention is not limited to this architecture.

Each of the processing cores 12 also may be associated with memory 19 such as cache memory, for example, formed of static random access memory (SRAM). Such memory 19 is typically constructed of four MOSFET transistors connected to form cross-coupled inverters to operate as a flip-flop. Additional transistors may be used for controlling memory cell readout.

Each of the cores 12 may be associated with gate reliability circuitry 18 that may predict failure of the core 12 and each of the memories 19 may be associated with memory reliability circuitry 20 that will predict failure of the memories 19. Both of these structures will be described below. Operation of the gate reliability circuitry 18 and memory reliability circuitry 20 may be coordinated by global reliability circuitry 21 which may operate together with the operating system to time the operation of the gate reliability circuitry 18 and memory reliability circuitry 20 and to evaluate data from the gate reliability circuitry 18.

Figure 2:
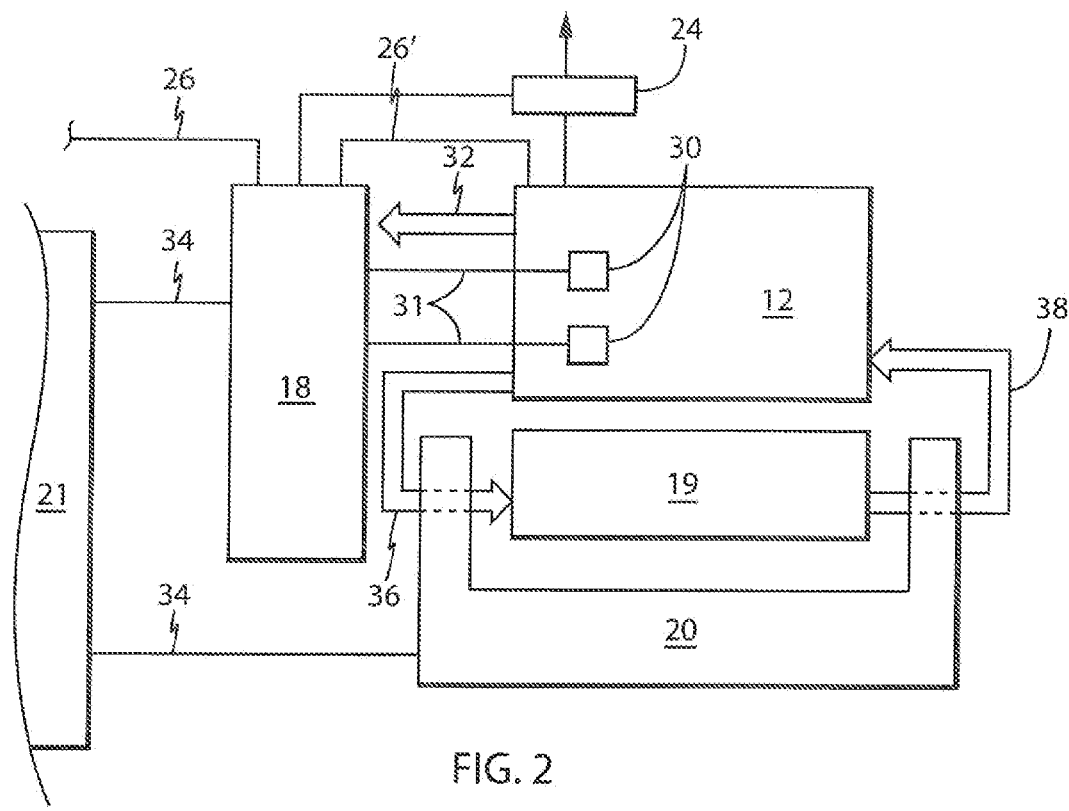
FIG. 2 is a simplified block diagram of one core, gate reliability circuit and memory reliability circuit.

Referring now to FIG. 2, generally the gate reliability circuitry 18 may control an operating voltage 22 supplied to the cores 12 through a controllable regulator 24 to independently vary the voltage received by each of the cores 12. Specifically the controllable regulator 24 may be used to change the voltage received by the associated core 12 between a normal operating voltage ($V_{dd}$) and a lower operating voltage, the latter simulating aging as will be discussed. The voltage regulator 24 may consist of a set of parallel transistor elements providing a variable voltage drop depending on the number of transistors activated.

The gate reliability circuitry 18 may further receive a standard clock signal 26 and provide phase adjusted clock signals 26 to selected fast gate paths 30 in the core 12, as will be discussed. These phase adjusted clock signals 26 also provide for simulated aging. In addition, the gate reliability circuitry 18 may capture an output 32 of the associated core 12 at a predetermined coordinated time or at comparable architectural states.

The gate reliability circuitry 18 may communicate with the global reliability circuitry 21 through a lightweight communication network 34 allowing the global reliability circuitry 21 to activate the gate reliability circuitry 18 to selectively age the core 12 and to capture the output 32 and transmit that output to the global reliability circuitry 21 to compare with outputs of other cores 12 in a detection process. Further details of the structure of the gate reliability circuitry 18 may be found in U.S. patent application Ser. No. 14/012,255 cited above.

Referring still to FIG. 2, the memory reliability circuitry 20 may also communicate with the global reliability circuitry 21 through the lightweight communication network 34 to receive signals coordinating the actions of the memory reliability circuitry 20. Generally, the memory reliability circuitry 20 may control the flow of data passing between the core 12 and the memory 19 in the form of write data 36 from the core 12 to the memory 19 and read data 38 from the memory 19 to the core 12.

Figure 3:
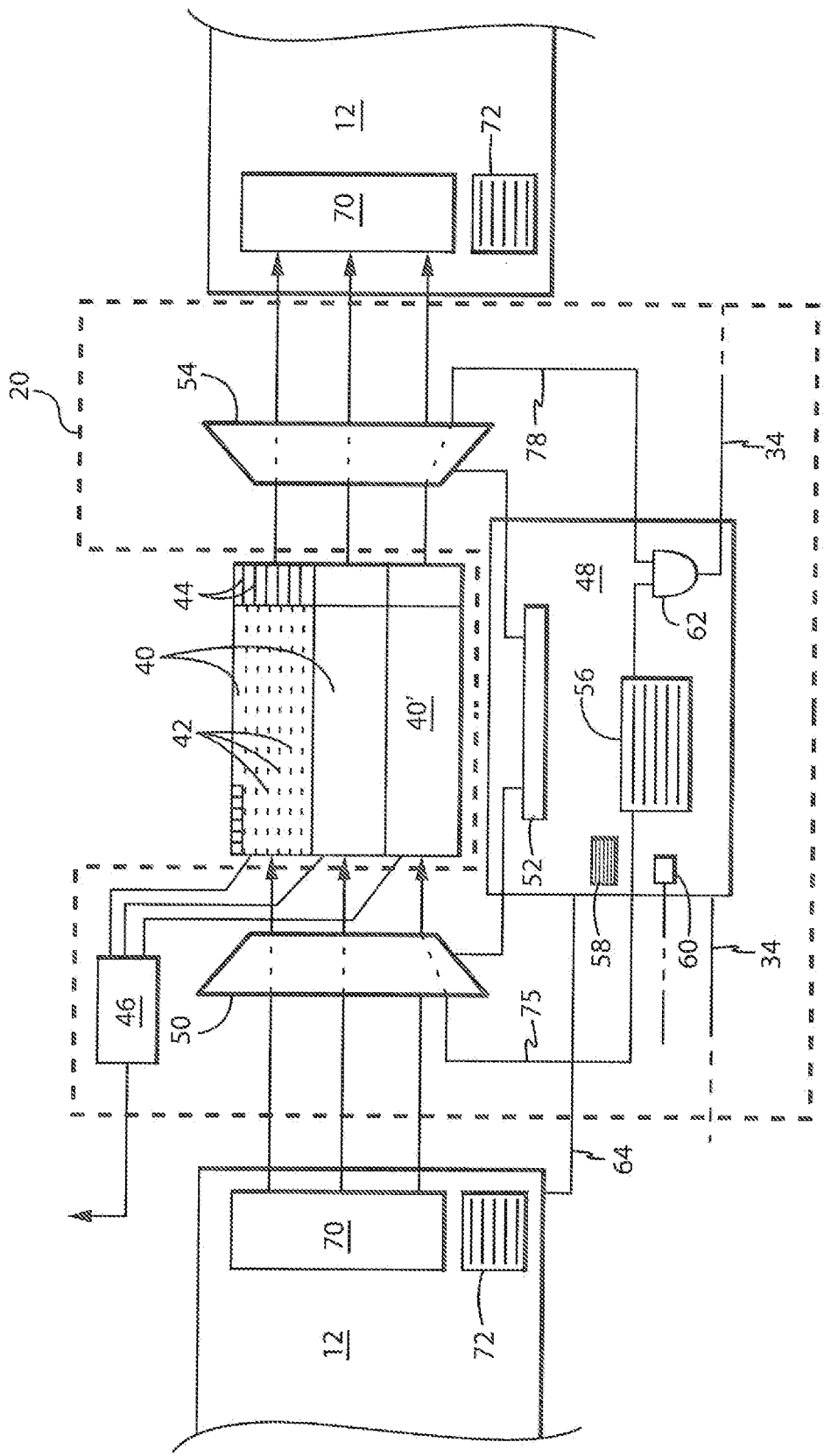
FIG. 3 is a detailed block diagram of the memory reliability circuit showing voltage control circuitry for independent voltage control of different memory groups and input and output multiplexers for applying test vectors to particular blocks under test.

Referring now to FIG. 3, the memory 19 may be generally divided into blocks or groups 40 that may be separately controlled and accessed. Each group 40 may provide storage for one or more memory lines 42 comprised of collections of memory bits each held in individual memory cells 41. Each memory line 42 may be associated with corresponding error correction circuitry 44 providing error correction bits and circuitry that may detect errors resulting from faults in the memory bits of each memory line 42 up to a predetermined detection limit. The error correction circuitry 11 may also correct detected errors caused by faults in the memory bits of each memory line 42 up to a predetermined correction limit generally lower than the detection limit and often allowing for the correction of only a single error for reasons of cost. Generally such error correction circuitry 44 is understood in the art and may employ a variety of different correction protocols such as cyclic redundancy coding to detect and correct memory errors.

The memory reliability circuitry 20 may provide for a voltage control system 46 independently controlling a supply voltage $V_{dd}$ to each of the groups 40 according to a test control circuit 48. In this way individual groups 40 may receive a normal supply voltage $V_{dd}$ for normal operation or a reduced supply voltage below $V_{dd}$ to simulate aging of the transistors forming the memory cells 41 of that group 40 during a test procedure.

The memory reliability circuitry 20 further provides a write multiplexer 50 for receiving data to be written to the memory 19 from the core 12 and/or from the test control circuit 48. The timing circuit 52 also controls a read multiplexer 54 receiving data output from the memory 19 to be transmitted to the core 12 or to the test control circuit 48. Generally the write multiplexer 50 and read multiplexer 54 allow the normal flow of data between the core 12 and memory 19 to be interrupted for any given group 40 to permit a test vector 75 from a test vector table 56 in the test control circuit 48 to be applied to the given group 40 and a modified test vector 78 from the given group 40 to be received by the test control circuit 48. The timing circuit 52 also communicates with the global reliability circuitry 21 so that it may coordinate its operation with gate reliability circuitry 18 and with the processor core 12 to receive a precise interrupt as will be discussed.

The test control circuit 48 will also include a block state table 58 providing the status of the groups 40 (enabled or disabled) and an aging register 60 determining an aging of the groups 40 during the test such as provides a controllable window of prediction and a comparison circuit 62 used to detect errors in the groups 40 as will also be discussed below.

In addition to the operation of the memory reliability circuitry 20, in the case where the memory 19 is a cache memory, data to and from the core 12 may also be controlled by a cache control circuit 70 working with a cache state table 72 to provide for synchronization of distributed cache structures with a main memory according to techniques known in the art. Under such techniques, cache coherence may be established with respect to the given groups 40 and the main memory, for example, using a MOST protocol in which the given groups 40 are indicated to be modified, shared, invalid, or owned. The memory reliability circuitry 20 may communicate with the cache control circuit 70 as will be discussed below, for example, and make use of the cache control circuit 70 to label groups 40 as modified and force their eviction when testing is being performed. In addition, the memory reliability circuitry 20 may disable given groups 40 that are subject to uncorrectable faults so that those blocks are no longer used as part of the cache structure and may communicate this fact to the cache control circuit 70 or comparable existing memory management structures. While the present invention works well with existing cache control circuit's 74 cache memory, the present invention is not limited to testing cache structures but may also test registers, tables, and dynamic random access memory structures.

Figure 4:
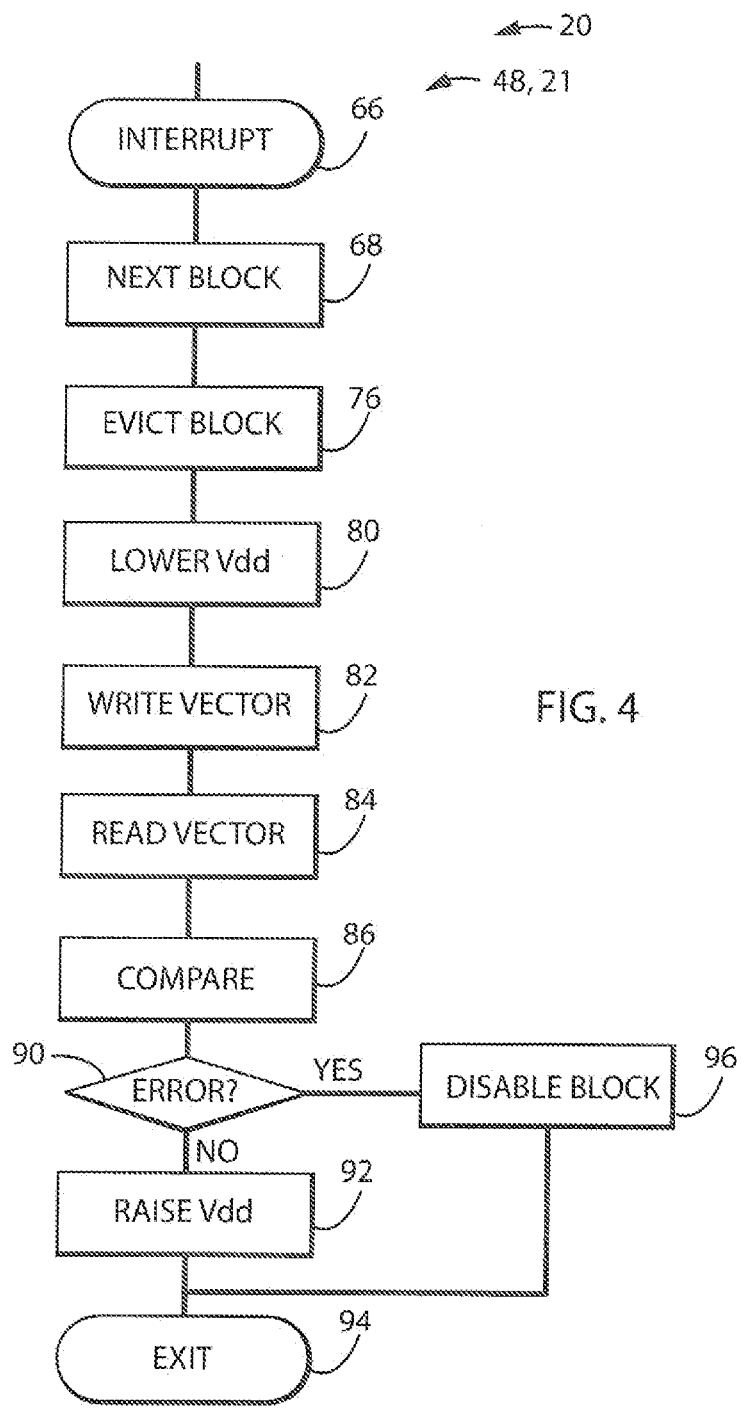
FIG. 4 is a flowchart of the steps implemented by the memory reliability circuit in a cycle of memory checking.

Referring now to FIGS. 3 and 4, the test control circuit 48, in coordination with the timing circuit 52, may receive a precise interrupt signal 64 from the core 12 as indicated by process block 66 triggering the start of the memory block test. The precise interrupt signal 64, as is understood in the art, defines an execution state in a core 12 capable of operating to execute instructions out-of-order where the core 12 is in a well-defined state generally subject to the following conditions: the program counter has been saved, all instructions before the program counter have been fully executed, no instructions after the program counter have modified registers or memory, and the execution state of the instruction at the program counter is known. In this case, structures such as load queues, rename tables, etc., are empty and thus will not be disturbed by the memory testing procedures of the present invention.

At process block 68, the timing circuit 52 selects a next group 40' in a round-robin fashion moving through the groups 40 in each successive cycle. One cycle is represented by the processes between process block 66 and 94.

The data of the selected group 40' is then evicted as indicated by process block 76 by communication with the cache control circuit 70, and afterward the timing circuit 52 controls the multiplexers 50 and 54 to disconnect the given group 40' from communication with the core 12 and connects the given group 40' to instead communicate with the test control circuit 48. The eviction ensures that the data is preserved in a different location unaffected by the reduction in voltage. More generally, the data may be moved or located in a way that preserves it for recovery after the aging test.

As indicated by process block 80, the supply voltage $V_{dd}$ on the test group 40' is then lowered to create an aging of that test group 40' according a voltage decrease determined by a value stored in the aging register 60. Aging by as little as one half of one day may be accomplished, but more typically aging amounts of several weeks or months will be implemented by an appropriate voltage reduction. In one embodiment, a reduction of the value of $V_{dd}$ of 45 millivolts may be used to provide an aging of approximately 28 weeks with respect to a normal operating voltage of 1.2 volts.

As indicated by process block 82, the test control circuit 48 next outputs a test vector 75 from vector table 56 through the multiplexer 50 to write the test vector to the groups 40'. Generally, the test vector is a pattern of one and zero values sized to simultaneously write to each line 42 of the group 40'. The particular pattern will be selected according to techniques known in the art according to architecture of the memory 19 in the particular group 40' to best illuminate expected modes of failure of memory cells 41. In the simplest case, however, the test vector may be all one values or all zero values or a regular pattern of alternating one and zero values. Generally the test vector 75 will vary over successive testing of group 40' across different cycles to provide testing of memory cells that are "stuck" at values of one or values of zero.

Per process block 84, a modified test vector 78 is next read out through multiplexer 54 from the group 40' representing the previously stored test vector 75 as modified by possible memory cell errors. This modified test vector 78 is compared, per process block 86, to the corresponding test vector 75 from table 56 by comparison circuit 62. If the memory group 40' as aged has not failed, this comparison will yield an indication that the test vector 75 is identical with the modified test vector 78 and no error will be detected at decision block 90 indicating that the memory group 40' is fully functional. This indication may be provided to the global reliability circuitry 21 over the lightweight communication network 34 or a lack of such communication may be interpreted as a successful test. In either case, the voltage $V_{dd}$ for the group 40' may be restored as indicated by process block 92, and the process implemented by the test control circuit 48 may exit per exit block 94 to await the next testing of another memory group 40. In cases where the memory 19 is not a cache, provision may be made to restore the evicted information into group 40'.

If at decision block 90 an error is detected in the group 40' evidenced by the lack of correspondence between the test vector 75 and modified test vector 78, then at process block 96 a error signal may be communicated over the lightweight communication network 34 and optionally memory group 40' is disabled by the test control circuit 48 as marked by block state table 58. This disabling eliminates the group 40' from subsequent testing and this information provided to the cache control circuit 70 which may then remove that group 40' from use as a cache structure. In the case of non-cache memory, similar communication may be made to a memory management unit to map around or avoid the bad memory structure.

Note that generally the output of the modified test vector 78 may be obtained after the error correction circuitry 44 so that the memory group 40' may be allowed to continue to operate even with errors so long as the errors may be corrected with the error correction circuitry 44. Generally then, the error correction circuitry 44, when an error is detected at the error detection limit, may be prevented from disabling of the line 42 of the corresponding group 40' in cases where high reliability is required, reflecting the fact that the next error could not be corrected and might require an additional use of the memory group 40' while correctable errors may be continued by virtue of the present invention until an error that cannot be corrected by the error correction circuitry 44 occurs. This can increase the life of a memory group 40 beyond that obtained with simple error correction codes alone because avoiding catastrophic errors with error correction codes alone mandates disabling the memory once the correction limit has been reached. Although an additional error can be detected (but not corrected) by the error correction codes, the errors will be detected only after they have occurred and disrupted operation of the computer. In contrast, the present invention anticipates or predicts an error to allow disabling the memory before disruption of operation of the computer but after a point at which errors can be corrected by the error correction codes.

Figure 5:
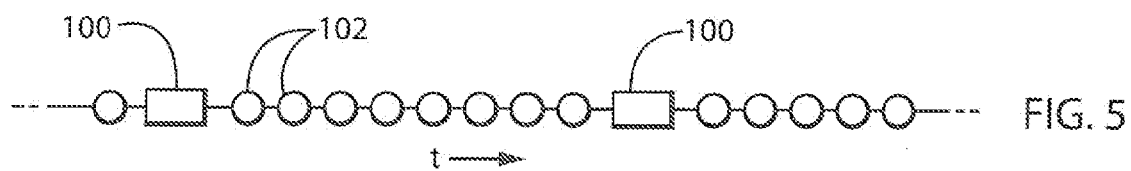
FIG. 5 is a timeline showing interlacing of memory checking and logic checking that may be implemented by the present invention.

Referring now to FIG. 5, the test cycle of FIG. 4 may occur periodically at S-epoch times 100 (aligned with precise interrupt), separated by multiple L-epoch times 102 during which times the logic circuitry of the cores 12 may be checked predictably for errors. The S-epoch times 100 and L-epoch times 102 are generally nonoverlapping and occur at different frequencies. Normally there will be more L-epoch times 102 than S-epoch times 100 reflecting relative numbers of cores 12 and memory groups 40 as well as the number of test repetitions necessary to provide a comprehensive understanding of failure.

Figure 6:
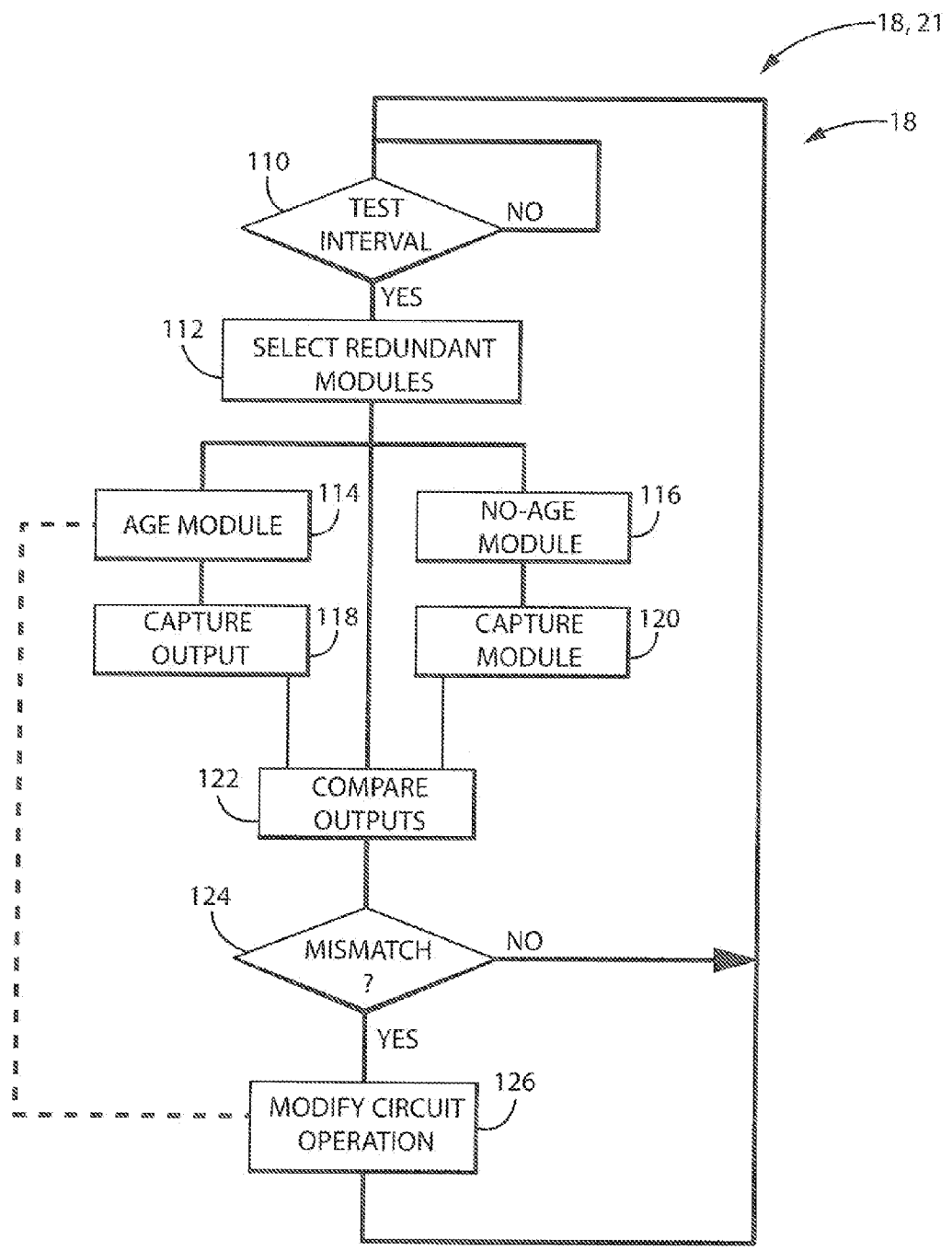
FIG. 6 is a flowchart of the steps implemented by the logic reliability circuit in a cycle of logic checking.

Referring now to FIGS. 3, 5 and 6, the gate reliability circuitry 18 may also operate cyclically at the L-epoch times 102 intervals as detected at decision block 110 to begin the aging process and predictive analysis of the cores 12. During the test interval of the L-epoch times 102, two or more redundant circuit modules, for example, two different cores 12, will be tested by artificially aging at least one of the circuit modules and then comparing outputs 32 of the aged circuit modules to an un-aged circuit module to see if there is any difference in the outputs. The comparison is provided by the L-epoch times 102 communicating with the gate reliability circuitry 18 of the different cores 12 communicated over the lightweight communication network 34.

Any difference in the outputs of these two circuit modules suggests a failure in the aged circuit module and accordingly fault is predicted in that aged circuit module. The time taken for the test (the test interval) will typically be a small proportion of the time during which testing is not performed, for example, one 10th of the latter or less. In this way the overhead of the prediction process is reduced and controllable.

If at decision block 110 the test interval has arrived, the circuits proceed to process block 112 and a selection is made of which redundant circuit modules will be tested (aged) and which will serve as a baseline. In one implementation, this selection process is a round-robin process in which different cores successively assume the roles of the aged and un-aged circuit modules. In the simplest case, two redundant circuit modules are selected and one is aged and one is not aged; however, it will be appreciated that multiple modules may be tested at the same time.

Upon selection of the target circuit modules, the global reliability circuitry 21 then applies aging to one selected redundant module as indicated by process block 114 and operates a second redundant circuit module as indicated by process block 116 without aging. The second redundant circuit module, when not used to check the output of the first redundant module as described below, may be used for running other programs (normal operation).

The aging process may use either or both of two mechanisms: aging by lowering the operating voltage (typically used for slow logic gate paths) through the regulator 24 and aging by clock phasing (typically used for fast logic gate paths) using phase clock signals 31.

After the artificial aging introduced by lowering the operating voltage and/or phasing of the clock signals 31, the outputs of the aged modules and un-aged modules are captured as indicated by process box 118 and 120 as captured values, for example, by a trace latch on the output of each core 12. At process block 122, these captured values are compared typically by forwarding them back over lightweight communication network 34 to the global reliability circuitry 21. Any discrepancy in the captured values of these differentially aged modules as detected at decision block 124 triggers a modification of circuit operation as indicated by process block 126.

A failure by an individual core 12 may provide a signal to the operating system so that it allocates computational tasks only among the other cores 12.

The present invention is not limited to use with microprocessor cores and can be used in any integrated circuit architecture having multiple redundant circuit modules. It will be appreciated that the redundant circuit modules used for predicting failure need not be identical if they have functionally comparable outputs. Although the present invention, anticipates full coverage of the circuit modules of the integrated circuit, it will be appreciated that it can be applied to only portions of an integrated circuit, for example, providing critical function of the integrated circuit.

Certain terminology is used herein for purposes of reference only, and thus is not intended to be limiting. For example, terms such as "upper", "lower", "above", and "below" refer to directions in the drawings to which reference is made. Terms such as "front", "back", "rear", "bottom" and "side", describe the orientation of portions of the component within a consistent but arbitrary frame of reference which is made clear by reference to the text and the associated drawings describing the component under discussion. Such terminology may include the words specifically mentioned above, derivatives thereof, and words of similar import. Similarly, the terms "first", "second" and other such numerical terms referring to structures do not imply a sequence or order unless clearly indicated by the context.

When introducing elements or features of the present disclosure and the exemplary embodiments, the articles "a", "an", "the" and "said" are intended to mean that there are one or more of such elements or features. The terms "comprising", "including" and "having" are intended to be inclusive and mean that there may be additional elements or features other than those specifically noted. It is further to be understood that the method steps, processes, and operations described herein are not to be construed as necessarily requiring their performance in the particular order discussed or illustrated, unless specifically identified as an order of performance. It is also to be understood that additional or alternative steps may be employed.

References to "a microprocessor" and "a processor" or "the microprocessor" and "the processor." can be understood to include one or more microprocessors that can communicate in a stand-alone and/or a distributed environment(s), and can thus be configured to communicate via wired or wireless communications with other processors, where such one or more processor can be configured to operate on one or more processor-controlled devices that can be similar or different devices. Furthermore, references to memory, unless otherwise specified, can include one or more processor-readable and accessible memory elements and/or components that can be internal to the processor-controlled device, external to the processor-controlled device, and can be accessed via a wired or wireless network.

It is specifically intended that the present invention not be limited to the embodiments and illustrations contained herein and the claims should be understood to include modified forms of those embodiments including portions of the embodiments and combinations of elements of different embodiments as come within the scope of the following claims. All of the publications described herein, including patents and non-patent publications are hereby incorporated herein by reference in their entireties.

What we claim is:

1. An integrated circuit system comprising:
a plurality of memory cells organized in groups and addressable to allow reading and writing of binary values to the memory cells;
a voltage control system independently applying a controllable voltage to the memory cells of different groups;
a memory reliability circuit communicating with the memory cells and voltage control system to, for a given group:
(a) reduce the voltage applied to the given group using the voltage control system to less than an operating voltage applied to other memory cells of other groups to simulate aging of the given group;
(b) write a test vector to the memory cells of the given group;
(c) read the test vector from the memory cells of the given group as a modified test vector change by any memory cell failure;
(d) compare the test vector to the modified test vector; and
(e) provide an output indicating predicted failure of the given group when the test vector does not match the modified test vector.

2. The integrated circuit system of claim 1 wherein the memory reliability circuit cycles through the groups of memory cells changing the given group in each cycle.

3. The integrated circuit system of claim 1 further including error correction circuitry associated with each group for correcting an effect of memory cell failure up to a predetermined number of memory cell failures and wherein the memory reliability circuit reads the modified test vector from the memory cells of the group after correction of errors by the error correction circuitry.

4. The integrated circuit system of claim 3 further including decommissioning circuitry for decommissioning a group of memory cells upon receiving the output indicating predicted failure of the group.

5. The integrated circuit system of claim 4 wherein the decommissioning circuitry decommissions the group of memory upon receiving the output indicating predicted failure of the group but not upon a failure less than the predetermined number of memory cell failures detected by the error correction circuitry.

6. The integrated circuit system of claim 1 further including decommissioning circuitry for decommissioning a group of memory cells upon receiving the output indicating predicted failure of the group.

7. The integrated circuit system of claim 1 wherein memory reliability circuit further ensures preservation of the data of the group at another storage location before writing the test vector.

8. The integrated circuit system of claim 1 wherein the memory cells are a cache memory.

9. The integrated circuit system of claim 1 wherein the test vector writes a nonuniform predetermined data pattern to the memory cells of the data group to promote memory cell failures promoted by interaction of memory cells.

10. The integrated circuit system of claim 1 wherein the integrated circuit system includes a processor providing precise interrupts and wherein the memory reliability circuit uses a precise interrupt to start the series of steps (a)-(e).

11. The integrated circuit system of claim 1 wherein the voltage reduction simulates an aging of the memory cells by less than one month.

12. The integrated circuit system of claim 11 wherein the voltage reduction simulates an aging of the memory cells by less than one day.

13. The integrated circuit system of claim 1 wherein the memory reliability circuit receives a data value controlling an amount of aging.

14. The integrated circuit system of claim 1 wherein the memory cells are static random access memory cells.

15. The integrated circuit system of claim 1 wherein the integrated circuit system further includes at least a first and second redundant circuit module each including multiple logic gates subject to increased gate delay with age, the first and second redundant circuit modules generating first and second respective outputs; and
gate reliability circuitry operating to:
(a) momentarily and selectively apply a stress to the first redundant circuit module in a manner mimicking age-increased gate delay without applying the stress to the second redundant circuit module;
(b) capture first and second values based on the respective first and second outputs from first and second redundant circuit modules during the stressing; and
(c) compare the captured first and second values to detect errors caused by the selective stressing.

16. The integrated circuit system of claim 15 wherein the gate reliability circuit executes step (a) at nonoverlapping times with execution by the memory reliability circuit of steps (a)-(c).

17. The integrated circuit system of claim 15 wherein the gate reliability circuit initiates an execution of step (a) repeatedly at a different rate than an initiation of execution by the memory reliability circuit of steps (a)-(c).

18. A method of predicting memory cell failure in an integrated circuit system having a plurality of memory cells organized in groups and addressable to allow reading and writing of binary values to the memory cells and having a voltage control system independently applying a controllable voltage to the memory cells of the different groups, the method comprising the steps of:
(a) reducing the voltage applied to the given group using the voltage control system to less than an operating voltage applied to other memory cells of other groups to simulate aging of the given group;
(b) writing a test vector to the memory cells of the given group;
(c) reading the test vector from the memory cells of the given group as a modified test vector changed by any memory cell failure;
(d) comparing the test vector to the modified test vector; and
(e) providing an output indicating predicted failure of the given group when the test vector does not match the modified test vector.

* * * * *